(12) United States Patent
Lee et al.

(10) Patent No.: US 8,017,461 B2
(45) Date of Patent: *Sep. 13, 2011

(54) METHODS OF FORMING SEMICONDUCTOR-ON-INSULATING (SOI) FIELD EFFECT TRANSISTORS WITH BODY CONTACTS

(75) Inventors: Sung-young Lee, Gyeonggi-do (KR); Dong-suk Shin, Gyeonggi-do (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 12/721,944

(22) Filed: Mar. 11, 2010

(65) Prior Publication Data

US 2010/0167474 A1 Jul. 1, 2010

Related U.S. Application Data

(60) Continuation of application No. 11/972,131, filed on Jan. 10, 2008, now Pat. No. 7,704,808, which is a division of application No. 11/082,069, filed on Mar. 16, 2005, now abandoned.

(30) Foreign Application Priority Data

Jun. 25, 2004 (KR) .................................. 2004-48211

(51) Int. Cl.
H01L 21/84 (2006.01)
(52) U.S. Cl. ................................. 438/151; 257/E21.561
(58) Field of Classification Search .......... 438/151–166; 257/E21.561
See application file for complete search history.

(56) References Cited

U.S. PATENT DOCUMENTS 5,043,778 A 8/1991 Teng et al. ..................... 257/374
(Continued)

FOREIGN PATENT DOCUMENTS

| CN | 1595624 A | 3/2005 |
|---|---|---|
| KR | 1020010036815 A | 5/2001 |
| KR | 1020010038179 A | 5/2001 |

OTHER PUBLICATIONS

Tian, Yu, et al., "A Novel Nanoscaled Device Concept: Quasi-SOI MOSFET to Eleminate the Potential Weaknesses of UTB SOI MOSFET", Apr. 2005, IEEE Trans. Elec. Dev, vol. 52, No. 4, p. 561-8.

*Primary Examiner* — Richard A. Booth
(74) *Attorney, Agent, or Firm* — Myers bigel Sibley & Sajovec, P.A.

(57) ABSTRACT

Semiconductor-on-insulator (SOI) field effect transistors include a semiconductor substrate and a first semiconductor active region on a first portion of a surface of the substrate. A first electrically insulating layer is provided. This first electrically insulating layer extends on a second portion of the surface of the substrate and also on a first sidewall of the first semiconductor active region. A second electrically insulating layer is provided, which extends on a third portion of the surface of the semiconductor substrate. The second electrically insulating layer also extends on a second sidewall of the first semiconductor active region. A second semiconductor active region is provided on the first semiconductor active region. The second semiconductor active region extends on the first semiconductor active region and on ends of the first and second electrically insulating layers. Source and drain regions are also provided, which are electrically coupled to opposite ends of the second semiconductor active region. An insulated gate electrode extends on the second semiconductor active region and opposite the first semiconductor active region.

12 Claims, 12 Drawing Sheets

U.S. PATENT DOCUMENTS

| | | | |
|---|---|---|---|
| 5,302,536 A | 4/1994 | Josquin | 438/595 |
| 5,943,575 A | 8/1999 | Chung | 438/300 |
| 6,346,729 B1 | 2/2002 | Liang et al. | 257/344 |
| 6,399,973 B1 | 6/2002 | Roberds | 257/288 |
| 6,437,405 B2 | 8/2002 | Kim | 257/347 |
| 6,670,675 B2 | 12/2003 | Ho et al. | |
| 7,485,557 B2 | 2/2009 | Han et al. | 438/589 |
| 7,704,808 B2 * | 4/2010 | Lee et al. | 438/151 |
| 2002/0140026 A1 | 10/2002 | Ishikawa et al. | 257/330 |

* cited by examiner

METHODS OF FORMING SEMICONDUCTOR-ON-INSULATING (SOI) FIELD EFFECT TRANSISTORS WITH BODY CONTACTS

CROSS-REFERENCE TO PRIORITY APPLICATIONS AND RELATED APPLICATION

This application is a continuation of U.S. application Ser. No. 11/972,131, filed Jan. 10, 2008, now U.S. Pat. No. 7,704, 808 which is a divisional of U.S. application Ser. No. 11/082, 069, filed Mar. 16, 2005, now abandoned which claims priority to Korean Application No. 2004-48211, filed Jun. 25, 2004. The disclosures of U.S. application Ser. Nos. 11/972, 131 and 11/082,069 are hereby incorporated herein by reference.

FIELD OF THE INVENTION

The present invention relates to semiconductor devices and methods of forming semiconductor devices and, more particularly, to field effect transistors and methods of forming field effect transistors.

BACKGROUND OF THE INVENTION

Semiconductor devices are typically manufactured in a bulk silicon substrate. However, when the silicon substrate is used, it is difficult to form a source region and a drain region with a small thickness. In addition, parasitic junction capacitance formed at an interface between the silicon substrate and the source and drain regions typically increases with smaller dimensions and may reduce operating speed.

In order to solve these problems, a semiconductor device having a silicon-on-insulator (SOI) structure has been developed. In the semiconductor device having a SOI structure, an insulator electrically insulates a bottom silicon substrate from a silicon layer formed above the bottom silicon substrate. A unit device is formed on the silicon layer. As will be understood by those skilled in the art, the electrical isolation results in a decrease in junction electrostatic capacitance generated between unit devices formed within an IC chip. In addition, a semiconductor device having an SOI structure may exhibit a decreased short channel effect, an increased sub-threshold swing, high mobility, and a decreased hot carrier effect compared to other conventional semiconductor devices.

However, a semiconductor device having an SOI structure includes an active region isolated from the silicon substrate, contrary to other conventional semiconductor devices. Therefore, a body contact is typically not formed, which means that SOI structures are prone to a floating body effect. The floating body effect occurs when excess carriers collect in a floating body during the operation of the semiconductor device, resulting in parasitic bipolar-driven breakdown and latch-up.

A semiconductor device having a quasi-SOI structure has been developed to solve this problem. A semiconductor device having a quasi-SOI structure has a body contact. That is, a contact hole is formed under a portion of the active region to allow excess carriers to be removed.

FIG. 1 is a cross sectional view of a semiconductor device having a conventional quasi-SOI structure. Referring to FIG. 1, an insulator 10 is formed only under a source region 3 and a drain region 5. As a result, the source region 3 and the drain region 5 are insulated from a bottom silicon substrate 1 by the insulator 10. Therefore, the semiconductor device having the conventional quasi-SOI structure has body contact in the same way as other conventional semiconductor devices. The semiconductor device of FIG. 1 further includes an isolation layer 2, a gate oxide layer 7, and a gate electrode 9.

The semiconductor device having the quasi-SOI structure may be manufactured using a following method. In a first method, oxygen ions are implanted into a bottom silicon substrate 1 using a gate electrode 9 as a mask, and the bottom silicon substrate 1 is oxidized by a high temperature thermal treatment to form an insulator 10. Therefore, in this case, the insulator 10 is formed after the gate electrode 9 is formed. However, the ion implantation and the heat treatment may adversely affect the gate oxide layer 7 and a channel ion implantation state. In a second method, an insulating material such as an oxide layer is deposited on a bottom silicon substrate 1, and patterned to form a patterned insulator 10. Then, silicon is deposited on the patterned insulator 10 by epitaxial growth, and a gate electrode 9 is patterned over the epitaxial silicon. However, when the gate electrode 9 is patterned using photolithography, the gate electrode 9 can be misaligned with the insulator 10, and this misalignment may result in device failure.

SUMMARY OF THE INVENTION

Semiconductor-on-insulator (SOI) field effect transistors according to embodiments of the invention include a semiconductor substrate and a first semiconductor active region on a first portion of a surface of the semiconductor substrate. This first semiconductor active region operates as a body contact. A first electrically insulating layer is provided. This first electrically insulating layer extends on a second portion of the surface of the semiconductor substrate and also on a first sidewall of the first semiconductor active region. When viewed in transverse cross-section, this first electrically insulating layer may be L-shaped. A second electrically insulating layer is provided, which extends on a third portion of the surface of the semiconductor substrate. The second electrically insulating layer also extends on a second sidewall of the first semiconductor active region. The second electrically insulating layer may also be L-shaped when viewed in transverse cross-section. A second semiconductor active region is provided on the first semiconductor active region. In particular, the second semiconductor active region extends on the first semiconductor active region and on ends of the first and second electrically insulating layers. Source and drain regions are also provided. These source and drain regions are electrically coupled to opposite ends of the second semiconductor active region. An insulated gate electrode extends on the second semiconductor active region and opposite the first semiconductor active region.

According to another embodiment of the present invention, there is provided a semiconductor device including a silicon substrate and a first silicon layer divided into two portions on the silicon substrate. An insulator pattern is interposed between the first silicon layer and the silicon substrate. The insulator pattern includes a portion interposed between the first silicon layer and the silicon substrate that is parallel to the upper surface of the silicon substrate, and a portion formed on a portion of the sidewalls of the first silicon layer that is perpendicular to the upper surface of the silicon substrate. The insulator pattern is symmetrical. A second silicon layer is formed on the silicon substrate and is surrounded by the insulator pattern, wherein an upper surface of the second silicon layer lies in the same plane as an upper surface of the insulator pattern. A third silicon layer is formed on the second silicon layer, wherein an upper surface of the third silicon layer lies in the same plane as the upper surface of the first silicon layer. A gate insulator layer and a gate electrode having equal widths are formed on the third silicon layer. A spacer is formed on sidewalls of the gate insulator and the gate electrode. A source region and a drain region, each having an extension unit formed in the third silicon layer below the spacer, are formed in the first silicon layer.

Additional embodiments of the invention include methods of forming a semiconductor-on-insulator (SOI) field effect transistor with body contact. These methods include forming a semiconductor substrate containing a bulk semiconductor region, a sacrificial layer on the bulk semiconductor region and a semiconductor source/drain layer on the sacrificial layer. The sacrificial layer may be a SiGe layer or a $CaF_2$ layer, for example. A step is performed to selectively etch through the semiconductor source/drain layer to define an opening therein and expose a portion of the sacrificial layer. A portion of the sacrificial layer is then selectively etched to expose an underside surface of the semiconductor source/drain layer and define a gap between the semiconductor source/drain layer and the bulk semiconductor region. After these etching steps, a step is performed to fill the gap and line sidewalls of the opening in the semiconductor source/drain layer with an electrically insulating layer. A portion of the electrically insulating layer in the opening is then selectively etched to expose a portion of the bulk semiconductor region. A first semiconductor active region is epitaxially grown from the exposed portion of the bulk semiconductor region. The electrically insulating layer is selectively etched back from within the opening in the semiconductor source/drain layer to expose sidewall portions of the semiconductor source/drain layer. A second semiconductor active region is then epitaxially grown. This second semiconductor active region extends on the first semiconductor active region and on the exposed sidewall portions of the semiconductor source/drain layer. An insulated gate electrode is formed on the second semiconductor active region.

According to another embodiment of the present invention, there is provided a method of manufacturing the semiconductor device. This method includes forming sequentially a sacrificial layer and a first silicon layer on a silicon substrate by epitaxial growth and forming a mask nitride layer on the first silicon layer to expose a region where a gate is to be formed. The first silicon layer is then etched to form a groove exposing the sacrificial layer using the mask nitride layer as an etch mask. The sacrificial layer is selectively removed with respect to the first silicon layer and the silicon substrate. An insulator is deposited to fill a space from which the sacrificial layer has been removed, and to cover an inner wall of the groove and an upper surface of the mask nitride layer. An insulator pattern is formed that exposes the upper surface of the mask nitride layer and an upper surface of a portion of the silicon substrate exposed by the groove by etching the insulator. A second silicon layer is then formed by epitaxially growing silicon on the portion of the silicon substrate exposed by the groove, with the second silicon layer being lower than the mask nitride layer. The insulator pattern is etched such that an upper surface of the insulator pattern lies in the same plane as an upper surface of the second silicon layer within the groove. A third silicon layer is formed by epitaxially growing silicon on the second silicon layer such that an upper surface of the third silicon layer lies in the same plane as a lower surface of the mask nitride layer within the groove. A spacer is formed exposing the third silicon layer on the inner wall of the groove. A gate insulator is formed on the third silicon layer. The groove is filled with a gate conductive layer and then the gate conductive layer is planarized to form a buried gate electrode in the mask nitride layer. A source region and a drain region are then formed.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

Figure 1:
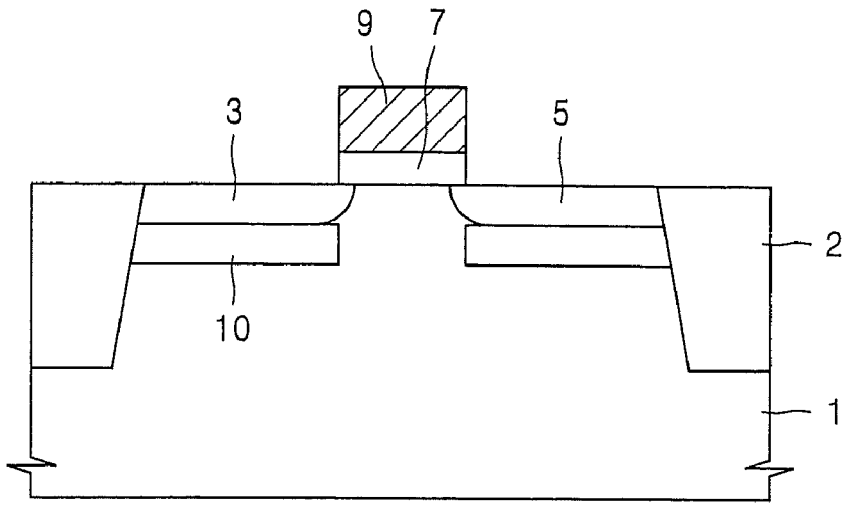
FIG. 1 is a cross sectional view of a semiconductor device with a conventional quasi-silicon-on-insulator (SOI) structure.

The present invention will now be described more fully hereinafter with reference to the accompanying drawings, in which preferred embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. It will also be understood that when a layer is referred to as being "on" another layer or substrate, it can be directly on the other layer or substrate, or intervening layers may also be present. Like numbers refer to like elements throughout.

Figure 2:
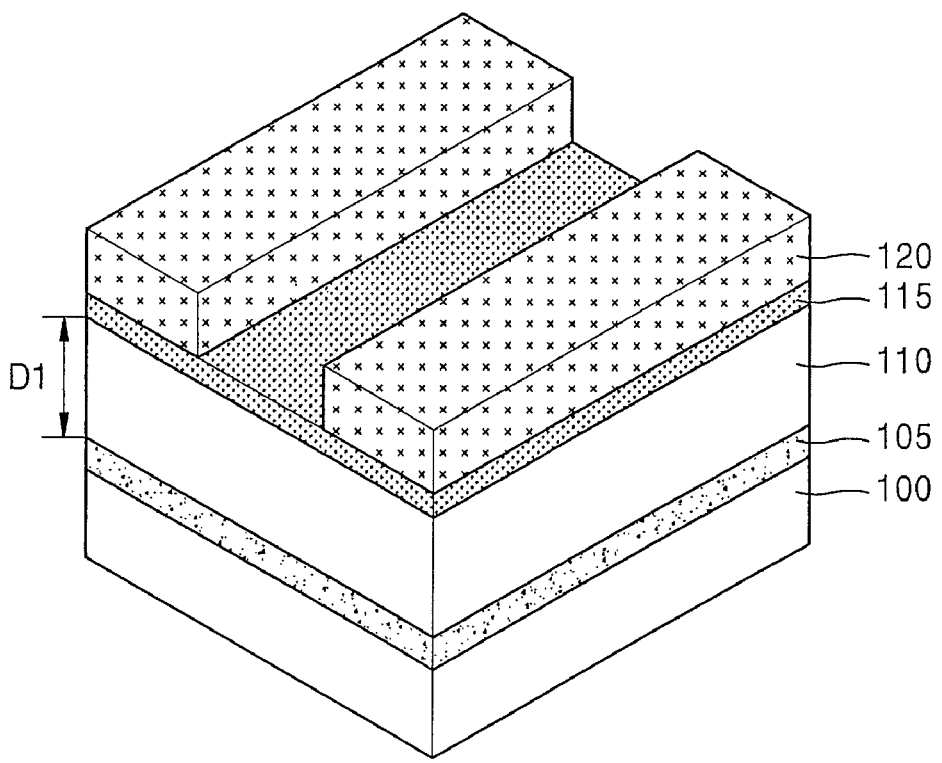
FIGS. 2 through 15 are perspective views illustrating a method of manufacturing a semiconductor device according to a first embodiment of the present invention.

FIGS. 2 through 15 are perspective views illustrating a method of manufacturing a semiconductor device according to a first embodiment of the present invention. Referring to FIG. 2, a sacrificial layer 105 is formed on a silicon substrate 100. In detail, a material which has a high etch selectivity relative to silicon and a lattice parameter similar to that of silicon is epitaxially grown on the silicon substrate 100 to form the sacrificial layer 105. For example, the sacrificial layer 105 can be formed of SiGe or $CaF_2$. Next, a first silicon layer 110 is formed on the sacrificial layer 105 by epitaxial growth. In the present embodiment, a thickness (D1) of the first silicon layer 110 corresponds to junction depths of a source region and a drain region, which are formed in a subsequent operation. Accordingly, the first silicon layer 110 must be formed to a proper thickness to decrease the resistance of the source region and the drain region.

Then, portions of the first silicon layer 110, the sacrificial layer 105, and the silicon substrate 100 are etched to form a trench (not shown) for isolating a device. The trench is filled with an insulating material, such as a high density plasma (HDP) oxide, to form a shallow trench isolation (STI)-type layer (not shown) that define active regions. FIG. 2 illustrates only a portion of the active regions.

Subsequently, a mask oxide layer 115 and a mask nitride layer 120 are deposited on the first silicon layer 110. The mask oxide layer 115 acts as a buffer layer by hindering the generation of stress due to differences in physical properties of the first silicon layer 110 and the mask nitride layer 120. Alternatively, the mask oxide layer 115 can be omitted. The mask oxide layer 115 can be formed by thermal oxidation. In order to form the mask nitride layer 120, a silicon nitride layer is deposited on the entire surface of the mask oxide layer 115 using plasma enhanced-chemical vapor deposition (PE-CVD) or low pressure-CVD (LP-CVD), and then patterned to expose a region where a gate is to be formed in a subsequent operation. Thus, the mask nitride layer 120 is formed as a reverse gate pattern.

Figure 3:
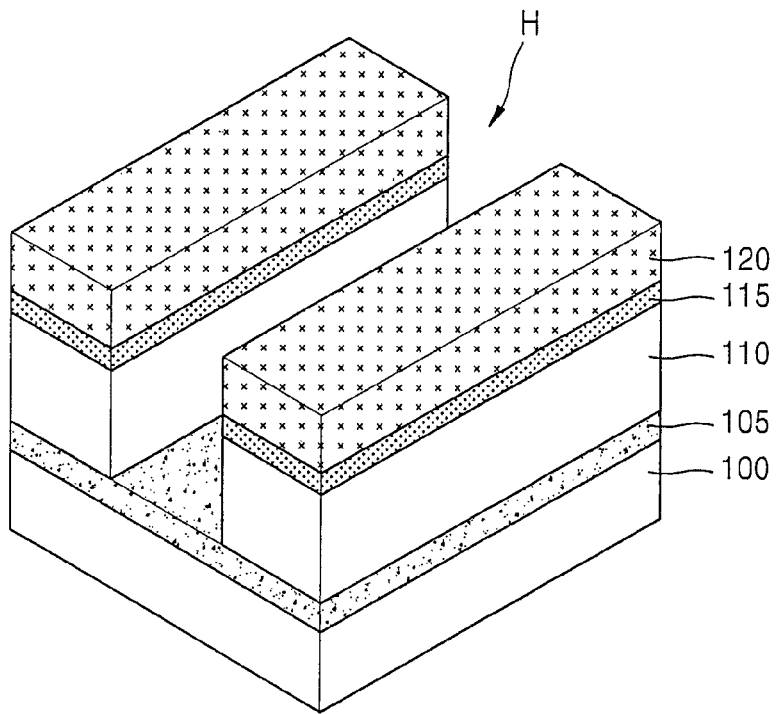

Referring to FIG. 3, the mask nitride layer 120 is used as an etch mask to anisotropically etch the mask oxide layer 115 and the first silicon layer 110 to form a groove H that exposes the sacrificial layer 105 contacting a bottom of groove H. A gate is to be formed in the groove H. The formation of the groove H results in separation of the first silicon layer 110 in a cross-sectional view.

Figure 4:
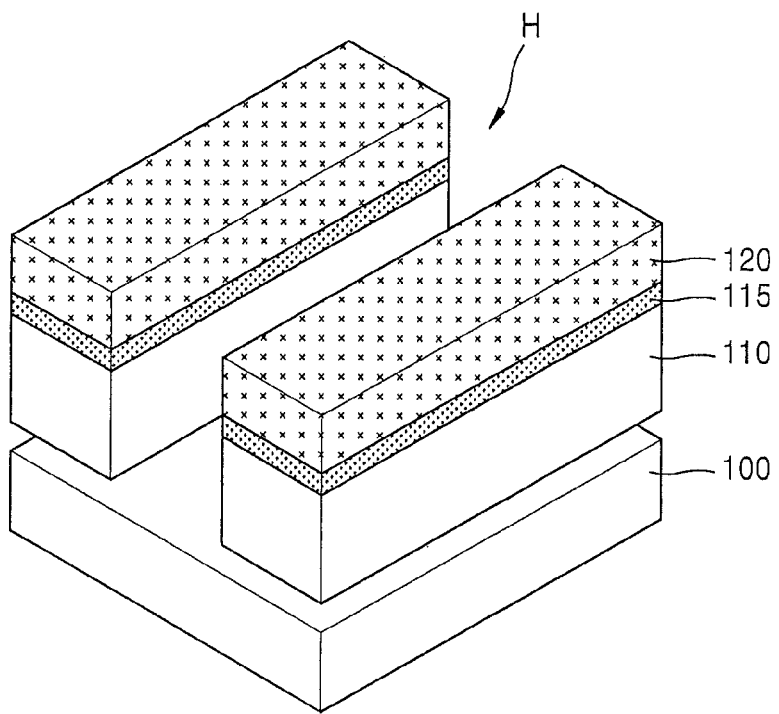

Then, referring to FIG. 4, the sacrificial layer 105 is etched selectively with respect to the first silicon layer 110 and the silicon substrate 100 to form an intermediate structure in which the illustrated portion of the sacrificial layer 105 is removed. The etching may be wet etching or dry etching. For example, when the sacrificial layer 105 is composed of SiGe, the sacrificial layer 105 is wet etched using a mixture of nitric acid, acetic acid, and hydrofluoric acid. Although FIG. 4 illustrates a complete separation between the first silicon layer 110 and the silicon substrate 100, in reality an isolation layer surrounding the active region supports the first silicon layer 110. Therefore, the first silicon layer 110 and the silicon substrate 100 are not completely separated. The seemingly complete separation in FIG. 4 is due to the fact that only a portion of the active region is illustrated.

Figure 5:
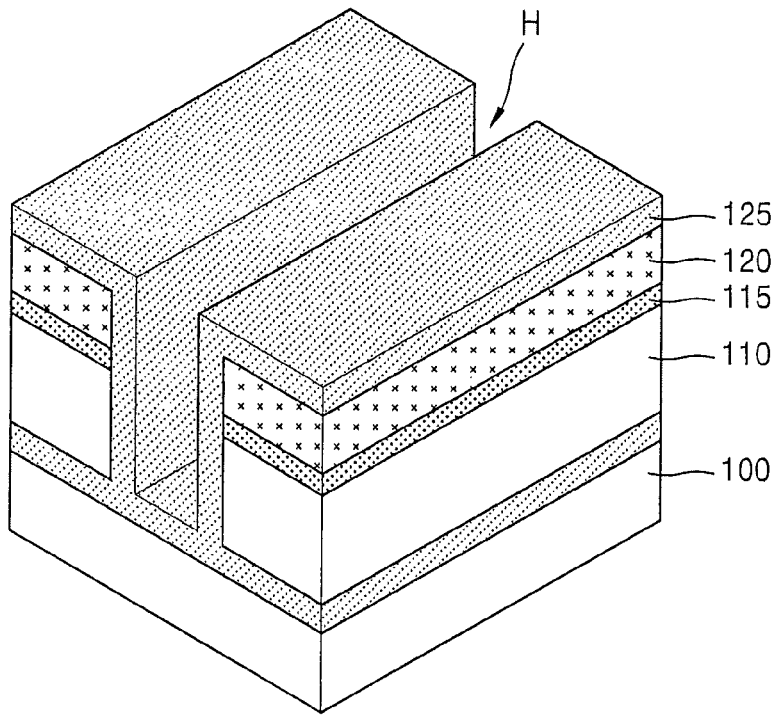

Referring to FIG. 5, an insulator 125 is deposited where the sacrificial layer 105 is removed, on an inner wall of the groove H, and on an upper surface of the mask nitride layer 120. The insulator 125 insulates a source region and a drain region from the silicon substrate 100. The insulator 125 is formed by depositing or coating a high dielectric material, such as $HfSiO_2$ and $HfO_2$, or a silicon oxide layer. Examples of the deposition or coating include atomic layer deposition (ALD), chemical vapor deposition (CVD), plasma enhanced-ALD (PE-ALD), and PE-CVD. Preferably, the insulator 125 is formed by any method with good step coverage.

Figure 6:
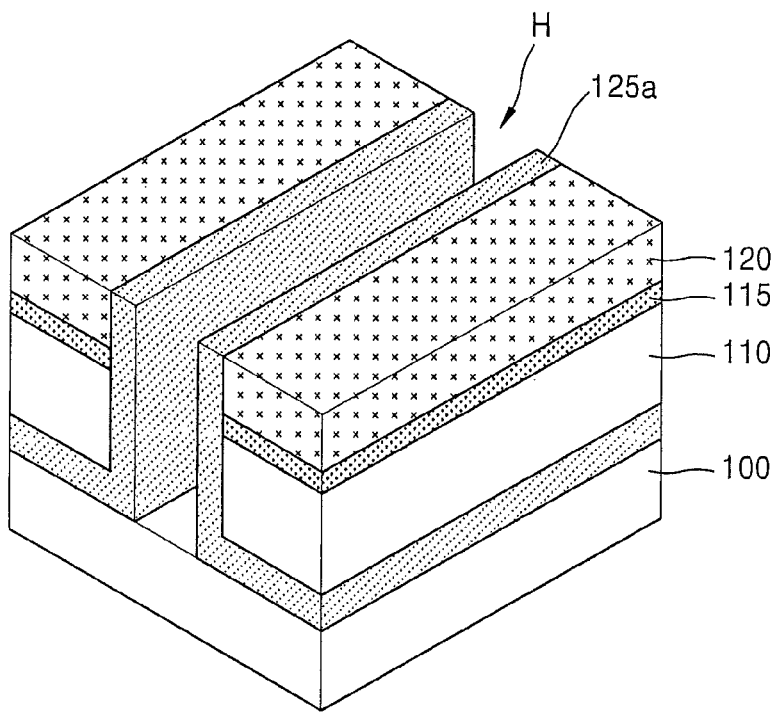

Referring to FIG. 6, spacer etching is performed. That is, the insulator 125 is anisotropically blanket etched to expose an upper surface of the mask nitride layer 120 and the upper surface of the silicon substrate 100 at the bottom of groove H. As a result, an insulator pattern 125*a* is formed. The insulator pattern 125*a* is interposed between the first silicon layer 110 and the silicon substrate 100 and parallel to the upper surface of the silicon substrate 100, and a portion of the insulator pattern 125*a* is formed on the inner wall of the groove H and perpendicular to the upper surface of the silicon substrate 100. In other words, the insulator pattern 125*a* has an L-shaped cross section, and is symmetric about the groove H. Alternatively, the insulator pattern 125*a* can be formed by the following method. First, the insulator 125 is etched using chemical mechanical polishing (CMP) to expose the upper surface of the mask nitride layer 120, and then anisotropically blanket etched to expose the upper surface of the silicon substrate 100 at the bottom of the groove H.

Figure 7:
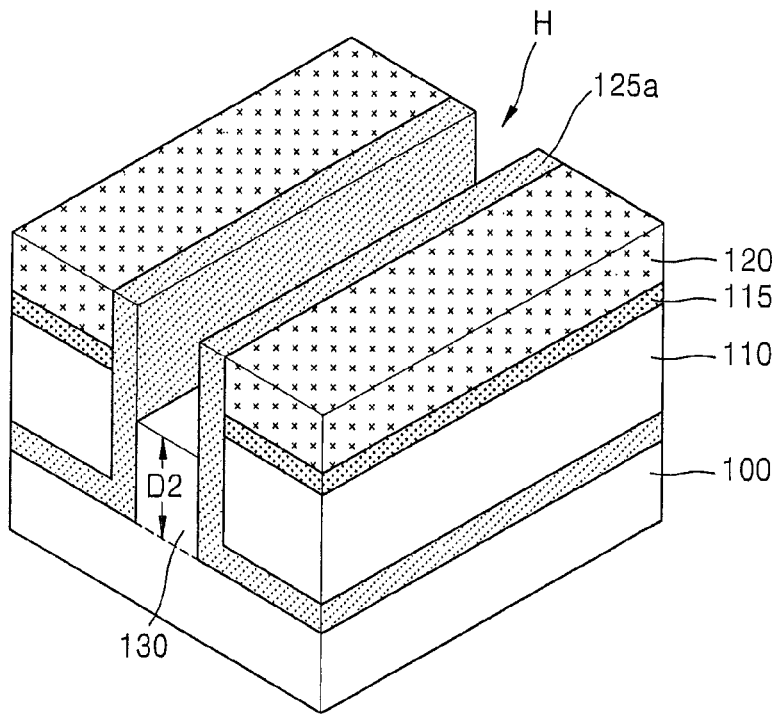

Referring to FIG. 7, silicon is epitaxially grown on the silicon substrate 100 in the bottom of the groove H such that the epitaxial silicon lies lower than the lower surface of the mask oxide layer 115. In the present embodiment, the height of the epitaxial silicon grown in the groove H will become a depth by which an extension unit of the source and drain regions are insulated from the silicon substrate 100 in the subsequent operation. As a result, it is desirable to determine a thickness D2 of the second silicon layer 130 in consideration of the above description.

Figure 8:
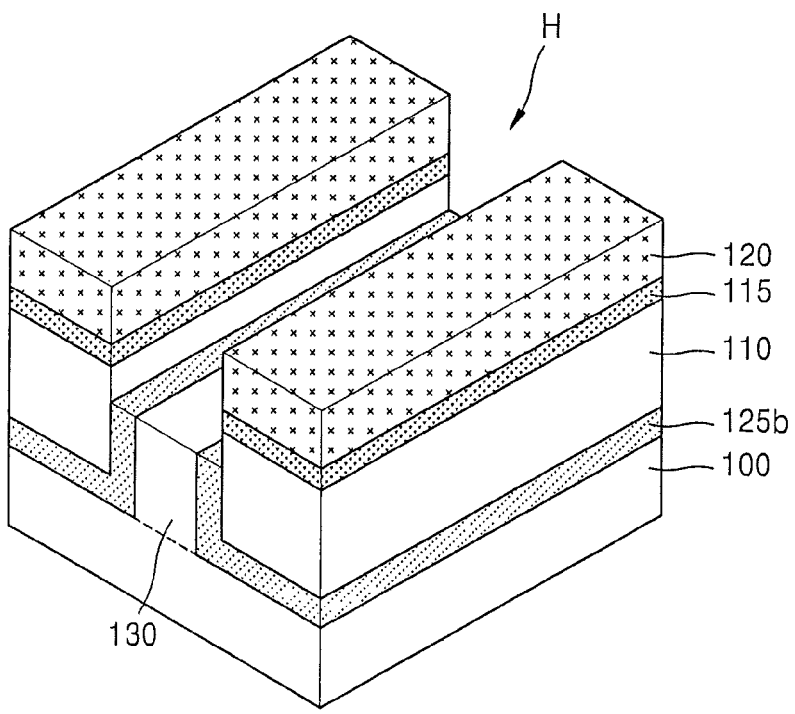

Referring to FIG. 8, the insulator pattern 125*a* is isotropically dry etched, for example chemical dry etched (CDE), until the insulator 125*a* extends up the wall of the groove H to an upper surface of the second silicon layer 130. As a result, an insulator pattern 125*b* is formed. A portion of the insulator pattern 125*b* perpendicular to the upper surface of the silicon substrate 100 contacts an extension unit of the source region and the drain region later.

Figure 9:
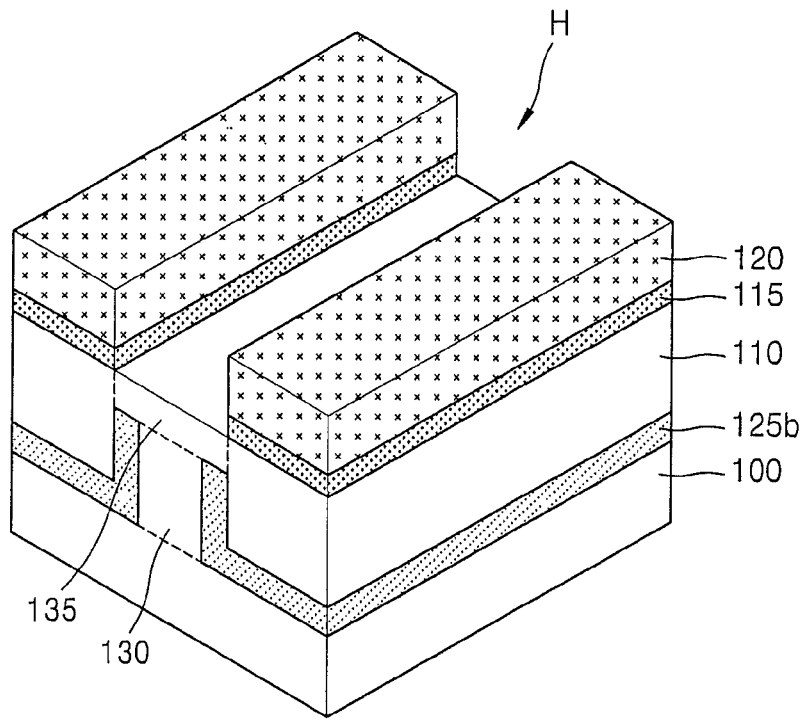

Referring to FIG. 9, silicon is epitaxially grown on the second silicon layer 130 to form a third silicon layer 135. An upper surface of the third silicon layer 135 extends to a lower surface of the mask oxide layer 115. That is, the upper surface of the first silicon layer 110 lies in the same plane as the upper surface of the third silicon layer 135. In this case, the silicon substrate 100, the first silicon layer 110, the second silicon layer 130, and the third silicon layer 135 all have an epitaxial relation with one another. As a result, there are no interfaces between them. However, for better understanding, an imaginary dotted line is illustrated in the figures.

Figure 10:
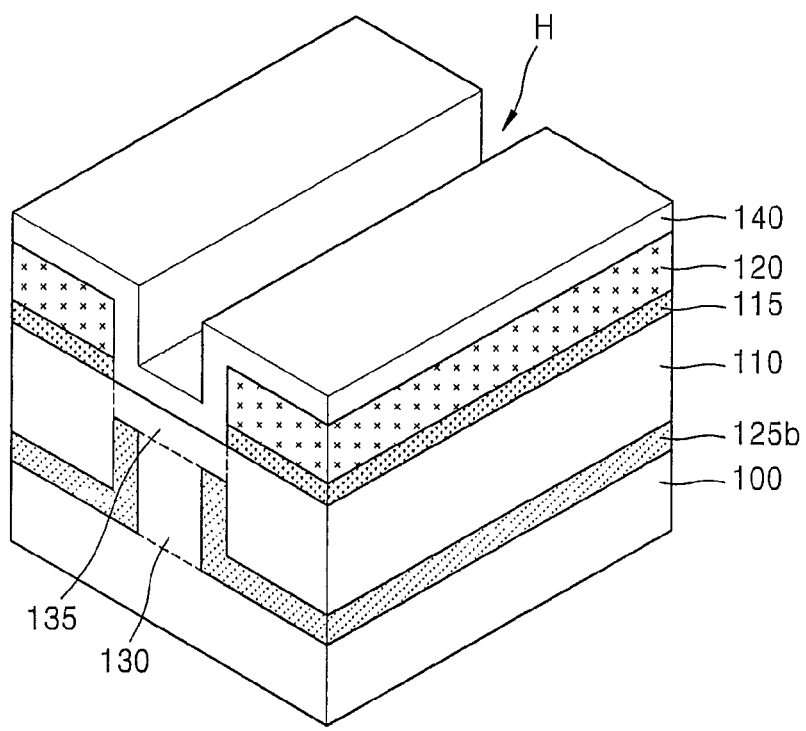

Referring to FIG. 10, a spacer insulator 140 is formed to a thickness insufficient to completely fill the groove H. The spacer insulator 140 is formed by, for example, depositing a silicon oxide layer using PE-CVD. A spacer formed from the spacer insulator 140 acts as a general gate spacer. In addition, in the present embodiment, since a gate electrode is to be formed within the groove H, the presence of the spacer insulator 140 decreases a region available for a gate electrode. As a result, a width of the gate electrode between adjacent portions of the mask nitride layer 120 can be adjusted by controlling the thickness of the spacer insulator 140.

Figure 11:
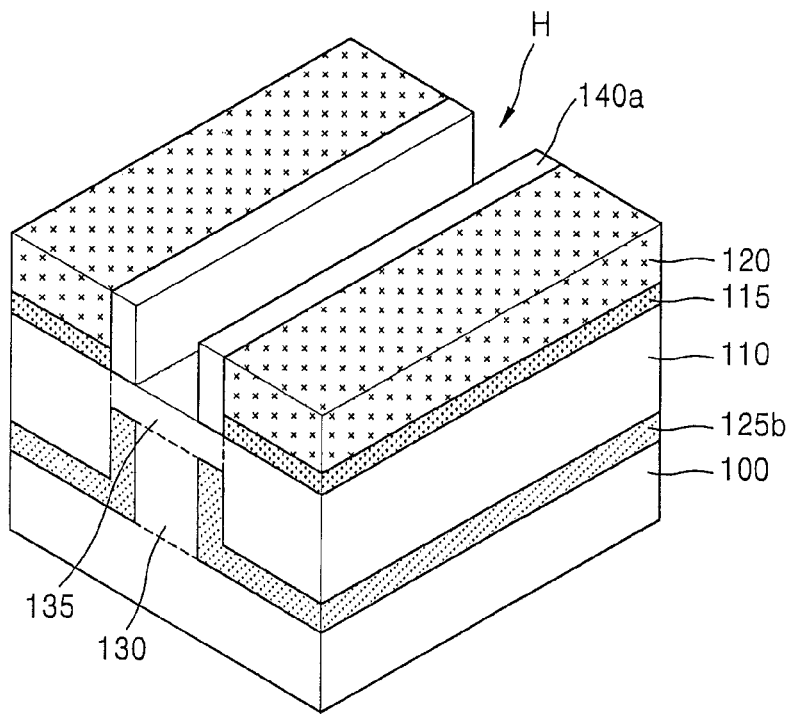

Referring to FIG. 11, the spacer insulator 140 is anisotropically blanket etched to form a spacer 140*a* on the inner wall of the groove H that exposes the third silicon layer 135 at the bottom of the groove H. The exposed third silicon layer 135 at the bottom of the groove H is to be a channel. If needed, local channel ion implantation (LCI) in which a dopant is implanted can be further performed. When LCI is used, the mask nitride layer 120 and the spacer 140*a* are used as an ion implantation mask. In a conventional structure and a conventional manufacturing method, even the source region and the drain region are counter doped, thus reducing the concentration of a dopant of the source region and the drain region. However, according to the present embodiment, only a channel portion is exposed while the mask nitride layer 120 and the spacer 140*a* mask the other regions. In this case, when using LCI, counter doping can be performed on only a desired portion.

Figure 12:
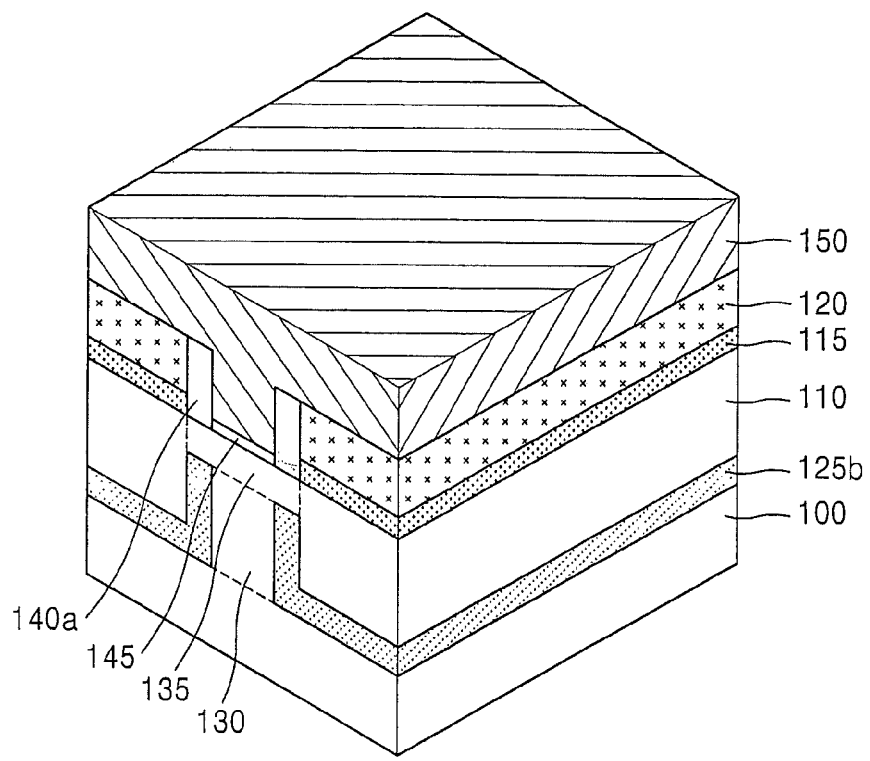

Referring to FIG. 12, a gate insulator 145 is formed on the third silicon layer 135 in the groove H shown in FIG. 11. A gate conductive layer 150 is formed to a thickness sufficient to completely fill the groove H. The gate insulator 145 can be formed by depositing a general silicon oxide layer or a high dielectric layer. The gate conductive layer 150 can be composed of metal or a conventional doped polysilicon. For example, a doped polysilicon is deposited, and then a silicide such as tungsten, titanium, cobalt, and the like, is further deposited to form the gate conductive layer 150. Alternatively, only a metal such as tungsten is deposited to form the gate conductive layer 150.

Figure 13:
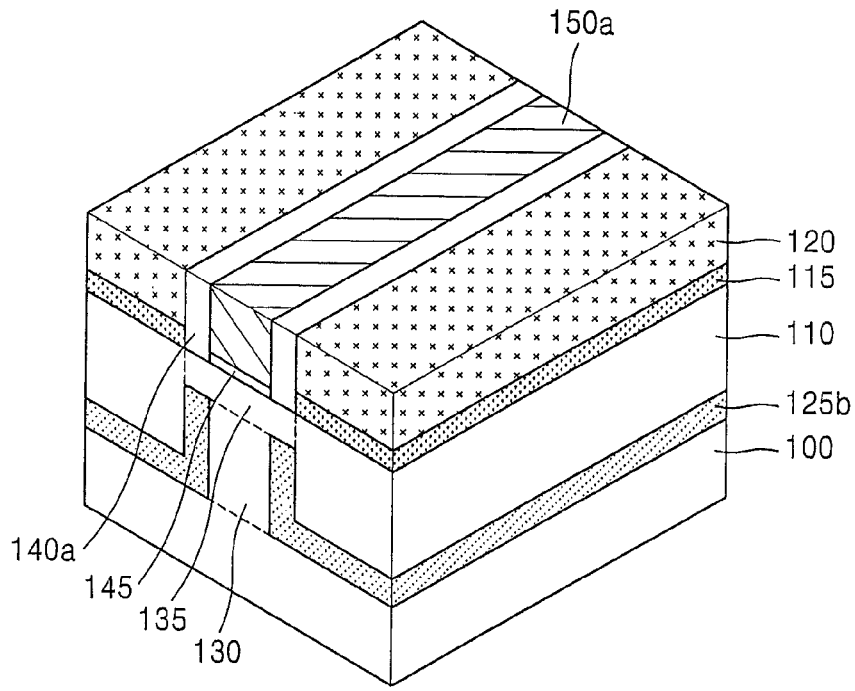

Referring to FIG. 13, CMP is performed until the mask nitride layer 120 is exposed to form a gate electrode 150*a* surrounded by the mask nitride layer 120. In the present embodiment, the gate electrode 150*a* is formed using a self-aligned Damascene method instead of photolithography. As a result, there is no chance of misalignment between the gate electrode 150*a* and the insulator pattern 125*b*.

Figure 14:
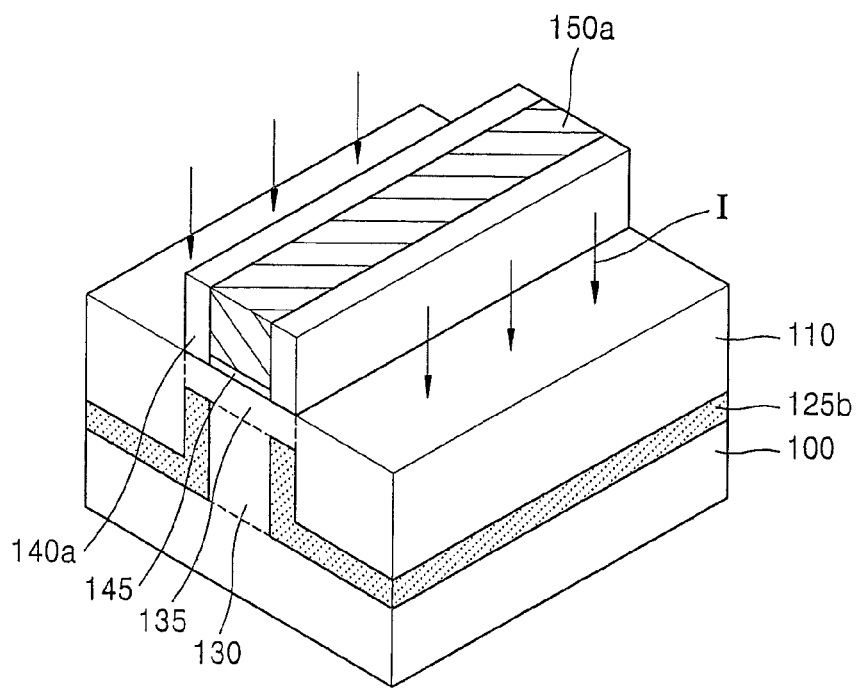
Figure 15:
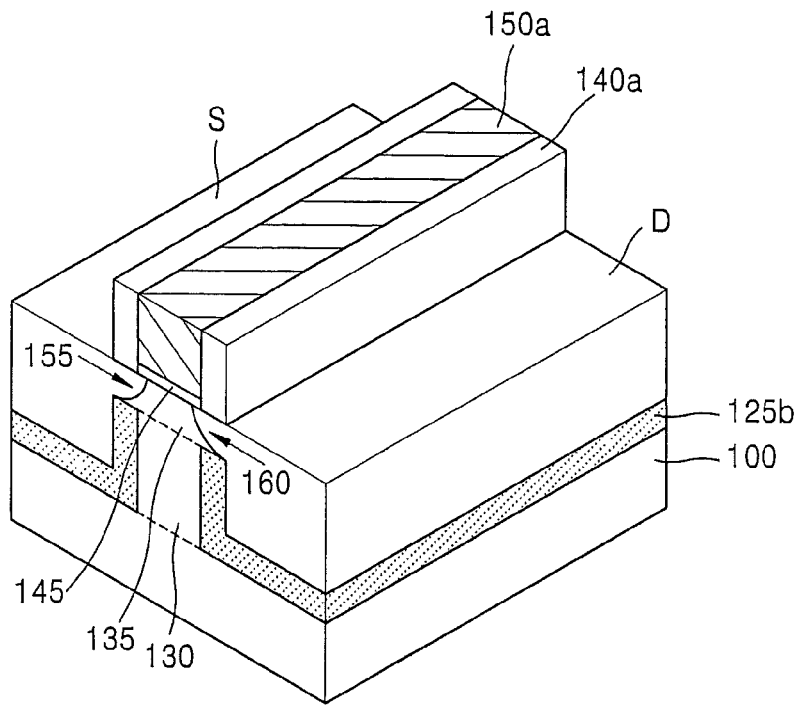

Referring to FIG. 14, the mask nitride layer 120 and the mask oxide layer 115 are removed to expose the first silicon layer 110. Then, a source/drain ion implantation (I) is performed. The mask nitride layer 120 can be removed by phosphoric acid stripping. The mask oxide layer 115 can be removed by wet etching. In the wet etching process, a diluted solution of HF or a buffered oxide etchant solution is used. After the source/drain ion implantation (I), heat treatment is performed. As a result, as shown in FIG. 15, a source region S and a drain region D having extension units 155 and 160, respectively, are formed above the insulator pattern 125b. The insulator pattern 125b has a portion parallel to the silicon substrate 100 and a portion perpendicular to the silicon substrate 100. The portion of the insulator pattern 125b parallel to the upper surface of the silicon substrate 100 insulates the source region S and the drain region D from the silicon substrate 100. The portion of the insulator pattern 125b perpendicular to the upper surface of the silicon substrate 100 insulates the extension units 155 and 160 from the silicon substrate 100. As a result, a quasi-SOI structure is completed.

As illustrated in FIGS. 14 and 15, the semiconductor device according to the present embodiment includes the silicon substrate 100, and the first silicon layer (110 shown in FIG. 14) formed on the silicon substrate 100. The first silicon layer 110 is divided. The insulator pattern 125b is formed between the first silicon layer 110 and the silicon substrate 100. The insulator pattern 125b has a portion interposed between the first silicon layer 110 and the silicon substrate 100 that is parallel to the upper surface of the silicon substrate 100 and a portion formed on a portion of a sidewall of the first silicon layer 110 that is perpendicular to the upper surface of the silicon substrate 100. The insulator pattern is symmetrical.

The second silicon layer 130 is formed on the silicon substrate 100 surrounded by the insulator pattern 125b. The upper surface of the second silicon layer 130 lies in the same plane as the upper surface of the insulator layer 125b. The third silicon layer 135 is formed on the second silicon layer 130. The upper surface of the third silicon layer 135 lies in the same plane as the upper surface of the first silicon layer 110. The gate insulator 145 and the gate electrode 150a are formed to the same width on the third silicon layer 135. The spacer 140a is formed on sidewalls of the gate insulator 145 and the gate electrode 150a. The source region S and the drain region D are formed in the first silicon layer 110. The source region S and the drain region D have the extension units 155 and 160 formed in the third silicon layer 135 below the spacer 140a, respectively.

The source region S and the drain region D are insulated from the silicon substrate 100 by the portion of the insulator pattern 125b parallel to the upper surface of the silicon substrate 100. The extension units 155 and 160 are insulated from the silicon substrate 100 by the portion of the insulator pattern 125b perpendicular to the upper surface of the silicon substrate 100. Sidewalls of the first silicon layer 110 and the spacer 140a are perpendicular to the upper surface of the silicon substrate 100. An interface between the spacer 140a and the gate electrode 150a is flat. The junction depths of the source region S and the drain region D correspond to the thickness of the first silicon layer 110. The thickness is denoted by D1 in FIG. 2. The first, second, and third silicon layers 110, 130, and 135 have an epitaxial relation with the silicon substrate 100.

According to the present embodiment, the gate electrode 150a is self-aligned, so there is no chance of misalignment between the gate electrode 150a and the insulator pattern 125b. According to the present embodiment, the thickness D1 of the first silicon layer 110 can be adjusted to control depth of the source region S and the drain region D insulated from the silicon substrate 100 by the insulator pattern 125b, thus lowering the junction resistance. The depth of the source region S and the drain region D is referred to as a junction depth. In addition, the thickness D2 of the third silicon layer 135, that is the height of a portion of the insulator pattern 125b perpendicular to the silicon substrate 100, can be adjusted to control the depth of the extension units 155 and 160 of the source region S and the drain region D insulated from the silicon substrate 100. Therefore, the insulator pattern 125b insulates the extension units 155 and 160 as well as the source region S and the drain region D from the silicon substrate 100. As a result, a device having the above-mentioned structure can be stably operated.

Accordingly, the semiconductor-on-insulator (SOI) field effect transistor of FIG. 15 may be treated as including a semiconductor substrate 100 and a first semiconductor active region 130 on a first portion of a surface of the semiconductor substrate 100. This first semiconductor active region 130 operates as a body contact. A first electrically insulating layer 125b (e.g., left side) is provided. This first electrically insulating layer 125b extends on a second portion of the surface of the semiconductor substrate 100 and also on a first sidewall of the first semiconductor active region 130. When viewed in transverse cross-section, this first electrically insulating layer 125b may be L-shaped. A second electrically insulating layer 125b (e.g., right side) is provided, which extends on a third portion of the surface of the semiconductor substrate 100. The second electrically insulating layer also extends on a second sidewall of the first semiconductor active region 130. A second semiconductor active region 135 is provided on the first semiconductor active region 130. In particular, the second semiconductor active region 135 extends on the first semiconductor active region 130 and on ends of the first and second electrically insulating layers 125b. Source (S) and drain (D) regions are also provided. These source and drain regions 155 and 160 are electrically coupled to opposite ends of the second semiconductor active region 135. An insulated gate electrode 150a extends on the second semiconductor active region 135 and opposite the first semiconductor active region 130.

The methods illustrated by FIGS. 2-15 may also be treated as including forming a semiconductor substrate containing a bulk semiconductor region 100, a sacrificial layer 105 on the bulk semiconductor region 100 and a semiconductor source/drain layer 110 on the sacrificial layer 105. The sacrificial layer 105 may be a SiGe layer or a $CaF_2$ layer, for example. A step is performed to selectively etch through the semiconductor source/drain layer 110 to define an opening H therein and expose a portion of the sacrificial layer 105. A portion of the sacrificial layer is then selectively etched to expose an underside surface of the semiconductor source/drain layer 110 and define a gap between the semiconductor source/drain layer 110 and the bulk semiconductor region 100. After these etching steps, a step is performed to fill the gap and line sidewalls of the opening in the semiconductor source/drain layer 110 with an electrically insulating layer 125. A portion of the electrically insulating layer 125 in the opening H is then selectively etched to expose a portion of the bulk semiconductor region 100. The remaining portion of the electrically insulating layer 125 is illustrated by the reference numeral 125a. A first semiconductor active region 130 is epitaxially grown from the exposed portion of the bulk semiconductor region 100. The electrically insulating layer 125a is selectively etched back from within the opening H in the semiconductor source/drain layer 110 to expose sidewall portions of the semiconductor source/drain layer 110. The remaining portion of the electrically insulating layer 125 is illustrated by the reference numeral 125b. A second semiconductor active region 135 is then epitaxially grown. This second semiconductor active region 135 extends on the first semiconductor active region 130 and on the exposed sidewall portions of the semiconductor source/drain layer 110. An insulated gate electrode 150a is formed on the second semiconductor active region 135.

The step of selectively etching through the semiconductor source/drain layer 110 may include forming an etching mask (115, 120) having an opening therein on the semiconductor source/drain layer 110. The step of forming an insulated gate electrode 150a may include forming a gate electrode spacer layer 140 on the etching mask, selectively etching back a portion of the gate electrode spacer layer 140 to expose a portion of the second semiconductor active region 135, and thermally oxidizing the exposed portion of the second semiconductor active region 135 to define a gate insulating layer 145. The step of thermally oxidizing the exposed portion of the second semiconductor active region 135 is followed by the steps of forming a gate electrode layer 150 that extends on the gate insulating layer 145 and on an upper surface of the etching mask (115, 120) and planarizing the gate electrode layer 150 to define a gate electrode 150a in the opening in the etching mask and expose the upper surface of the etching mask 120. The etching mask 120 is then etched back to expose portions of the semiconductor source/drain layer 110, which receive implanted source/drain region dopants.

Figure 16:
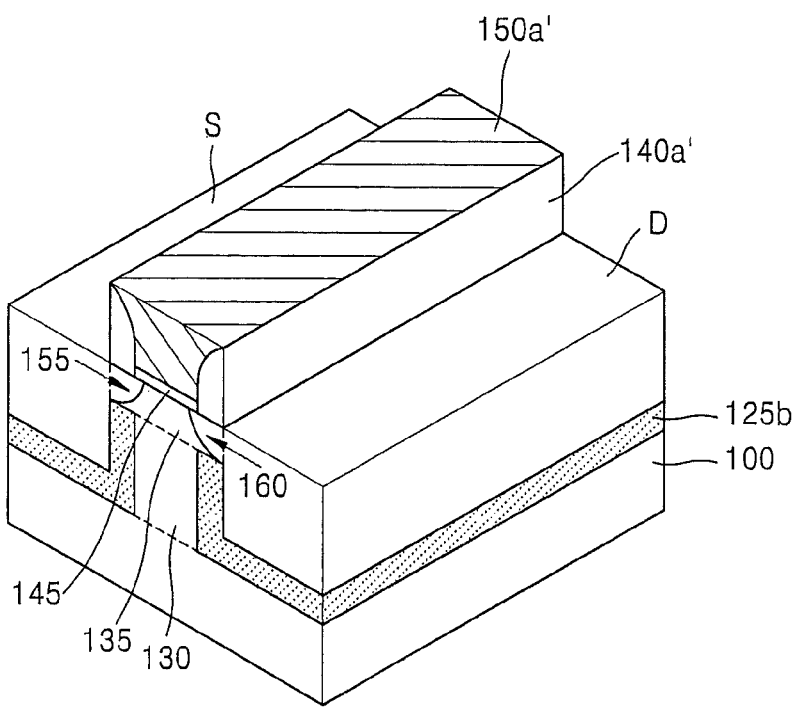
FIG. 16 is a perspective view of a semiconductor device according to a second embodiment of the present invention.

FIG. 16 is a perspective view of a semiconductor device according to the second embodiment of the present invention. The device illustrated in FIG. 11 is formed in the same manner as in the first embodiment, except an upper edge of the spacer 140a is rounded by using spacer etching characteristics. Subsequently, the remaining operations of the method of the first embodiment are performed to produce the semiconductor device shown in FIG. 16. In FIG. 16, elements similar to or identical with those described in FIGS. 2 through 15 are denoted by like reference numerals, and their description will be omitted.

Referring to FIG. 16, since an upper edge of a spacer 140a' is rounded, an interface between the spacer 140a' and a gate electrode 150a' is not flat. In the first embodiment, the interface was flat. A convex edge of the spacer 140a' faces the gate electrode 150a', and a concave edge of the gate electrode 150a' faces the spacer 140a'. If the conditions of manufacturing the semiconductor of the second embodiment are identical with those in the first embodiment except the shape of the spacer 140a' and the shape of the gate electrode 150a' due to the spacer 140a', the sectional area of the gate electrode 150a' perpendicular to the silicon substrate 100 increases. As a result, the resistance in the gate electrode 150a' decreases.

Additionally, the gate electrode 150a' has a greater upper surface area than in the first embodiment. Therefore, when the gate electrode 150a' is composed of doped polysilicon and an upper portion of the gate electrode 150a' is partly silicided to form a polycide structure, a larger region can be silicided in this present embodiment. As a result, resistance in the gate electrode 150a' can be further decreased.

Figure 17:
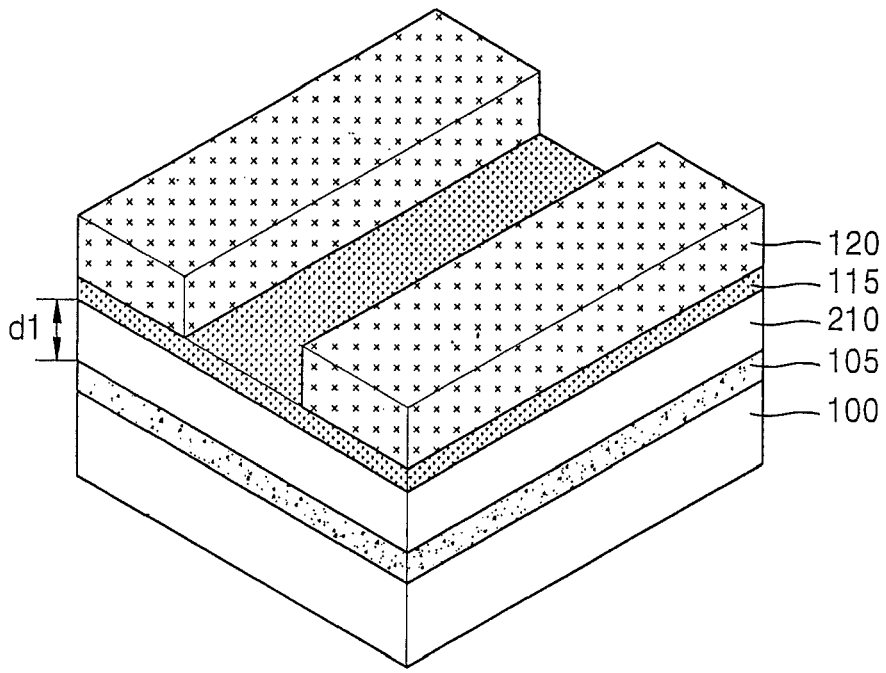
FIGS. 17 through 22 are perspective views illustrating a method of manufacturing a semiconductor device according to a third embodiment of the present invention.

FIGS. 17 through 22 are perspective views illustrating a method of manufacturing a semiconductor device according to a third embodiment of the present invention. Elements similar to or identical to those described in FIGS. 2 through 15 are denoted by like reference numerals, and their description will be omitted. Referring to FIG. 17, a stacked structure is manufactured in the same manner as described with reference to FIG. 2. A sacrificial layer 105, a first silicon layer 210, a mask oxide layer 115, and a mask nitride layer 120 are sequentially deposited on a silicon substrate. However, the thickness d1 of the first silicon layer 210 is smaller than the thickness d1 of the first silicon layer 110 in the first embodiment.

Next, the processes illustrated in FIGS. 3 through 6 are performed. In detail, a groove (H shown in FIG. 3) is formed in a region where a gate is to be formed later. Then, the sacrificial layer 105 is removed, and an insulator (125 shown in FIG. 5) is deposited. The deposited insulator is etched by, for example, spacer etching to form an L-shaped insulator pattern (125a shown in FIG. 6).

Figure 18:
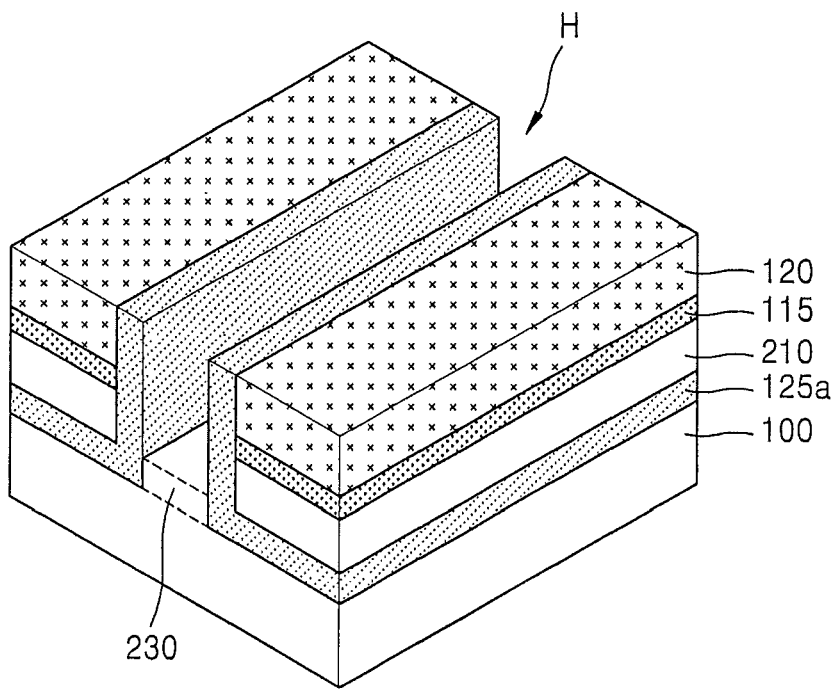

Referring to FIG. 18, as described with reference to FIG. 7, silicon is epitaxially grown on a portion of the silicon substrate 100 exposed by the groove H to form a second silicon layer 230, filling a lower portion of the groove H. In this case, silicon is grown to lower then the mask oxide layer 115. This embodiment differs from the first embodiment in that the second silicon layer 230 has the same thickness as the insulator pattern 125a.

Figure 19:
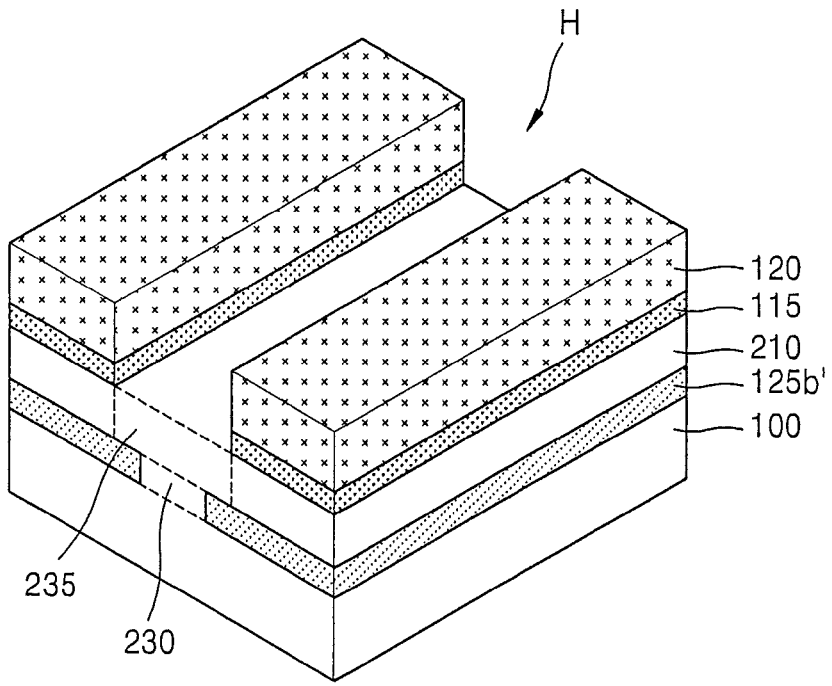
Figure 20:
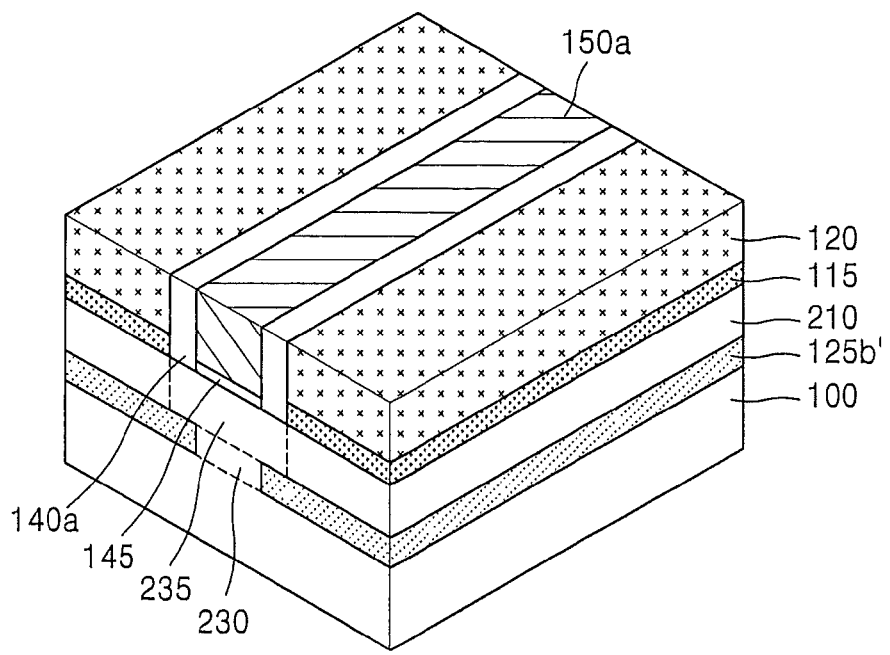

The process performed with reference to FIGS. 8 and 9 is repeated. As illustrated by FIG. 19, the insulator pattern 125a is etched until an upper surface of the insulator pattern 125a lies in the same plane as an upper surface of the second silicon layer 230. As a result, the insulator pattern 125a does not have a portion perpendicular to the upper surface of the silicon substrate 100. Then, silicon is again epitaxially grown on the second silicon layer 230 to form a third silicon layer 235 within the groove H, such that an upper surface of the third silicon layer 235 is in the same plane as an upper surface of the first silicon layer 210, and is in the same plane as a lower surface of the mask oxide layer 115.

Figure 21:
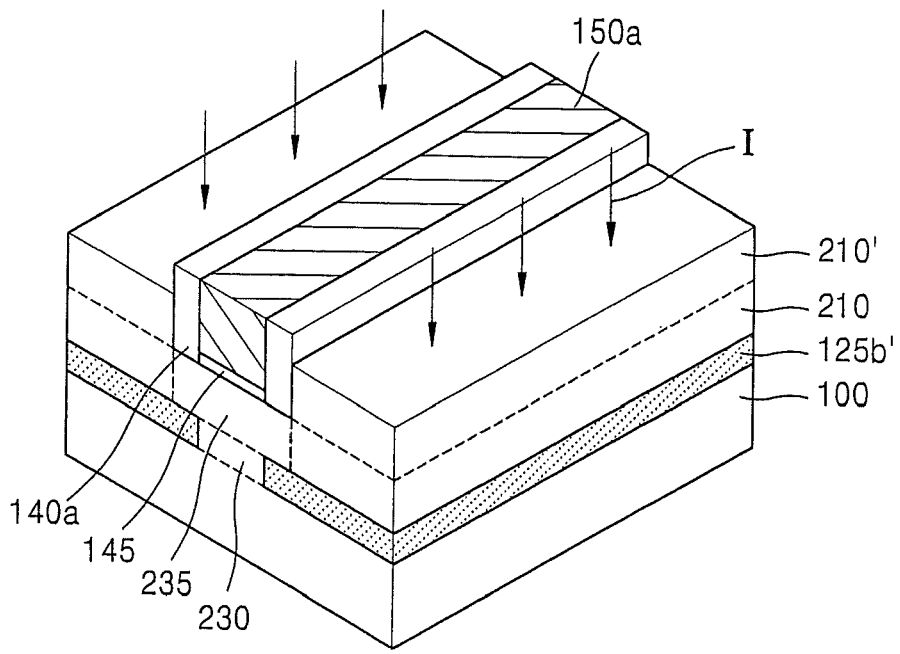

Then, the processes illustrated in FIGS. 10 through 13 are performed. In detail, referring to FIG. 20, spacers 140a are formed on sidewalls of a mask nitride layer 120, and a gate electrode 150a is formed between the spacers 140a using a damascene method. Subsequently, the first silicon layer 210 is exposed by removing the mask nitride layer 120 and the mask oxide layer 115. Referring to FIG. 21, silicon is epitaxially grown on the first silicon layer 210 to form a fourth silicon layer 210' elevated adjacent to the spacer 140a. Then, source/drain ion implantation (I) is performed on the fourth silicon layer 210' and the first silicon layer 210.

Figure 22:
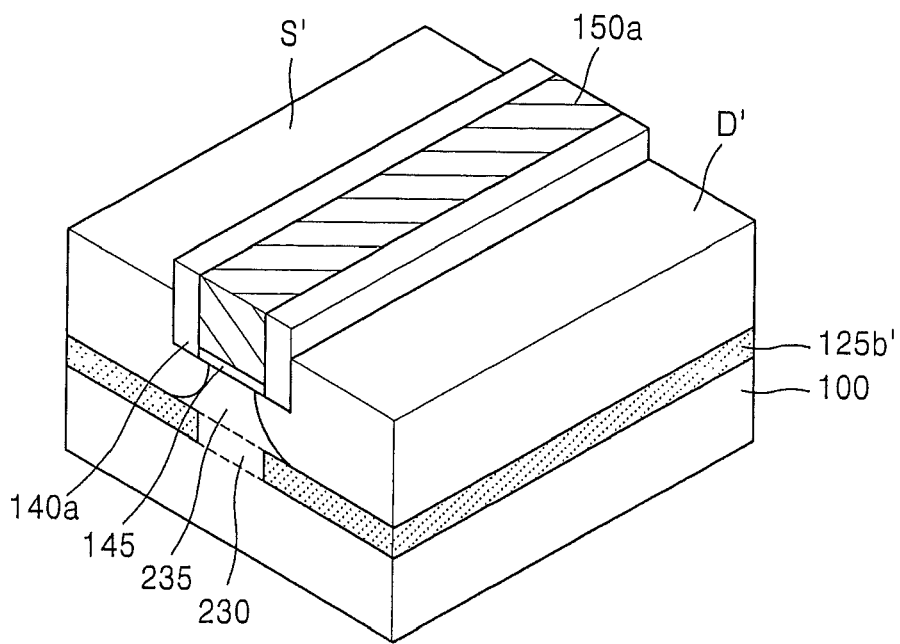

After the source/drain ion implantation (I) is completed, the first and fourth silicon layers 210 and 210' are annealed to form an elevated source region S' and an elevated drain region D', as shown in FIG. 22. As a result, the source region S' and the drain region D' have sufficiently low resistivity. In this case, the spacer 140a performs the same functions as the spacer according to the first embodiment, and also insulates the elevated source region S' and the elevated drain region D' from the gate electrode 150a.

Therefore, according to the present embodiment, the gate electrode 150a is self-aligned, so there is no chance of misalignment between the gate electrode 150a and the insulator pattern 125b'. In addition, the source/drain resistivity can be sufficiently decreased due to the elevated source region S' and the elevated drain region D'.

Figure 23:
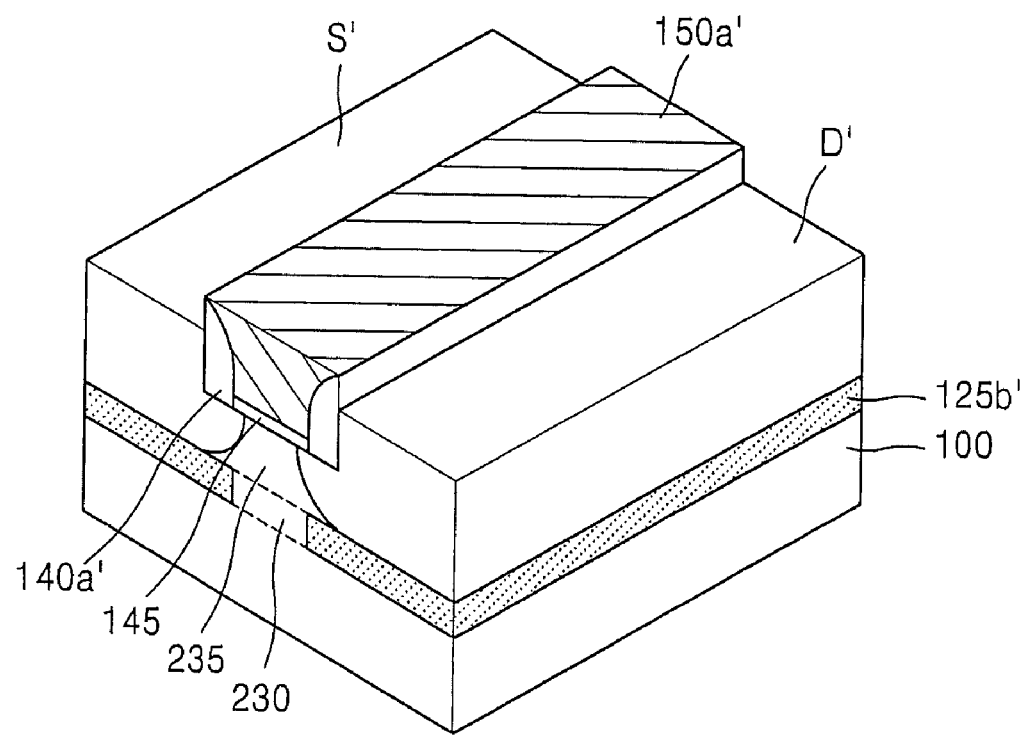
FIG. 23 is a perspective view of a semiconductor device according to a fourth embodiment of the present invention.

FIG. 23 is a perspective view of a semiconductor device according to a fourth embodiment according to the present invention. The semiconductor device is manufactured in the same manner as in the third embodiment, except that spacer 140a' have rounded upper edges. Elements similar to or identical with those described in FIGS. 2 through 22 are denoted by like reference numerals, and their descriptions are omitted. As in the second embodiment, a gate electrode 150a' according to the present embodiment has a larger cross-sectional and a large upper surface area than the gate electrode 150*a* in the third embodiment due to the shape of a spacers 140*a'*. As a result, the resistance of the gate electrode 150*a'* decreases. As described above, according to the present invention, a gate electrode is self-aligned, so there is no chance of misalignment between an insulator pattern and the gate electrode. In addition, predetermined junction depths of a source region and a drain region can be obtained by controlling the thickness of a first silicon layer. Extension units of the source region and the drain region can also be insulated from a silicon substrate by an insulator pattern. As a result, the semiconductor device can be operated stably. Also, source/drain resistance is decreased substantially, because the source region and the drain region are elevated.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A method of forming a semiconductor-on-insulator (SOI) field effect transistor with body contact, comprising:
    forming a semiconductor source/drain layer on a bulk semiconductor region;
    forming a first insulating layer between the semiconductor source/drain layer and the bulk semiconductor region and a second insulating layer at sidewalls of an opening in the semiconductor source/drain layer;
    selectively etching a portion of the first insulating layer in the opening to expose a portion of the bulk semiconductor region;
    epitaxially growing a first semiconductor active region from the exposed portion of the bulk semiconductor region;
    then selectively etching back the second insulating layer to expose sidewall portions of the semiconductor source/drain layer;
    epitaxially growing a second semiconductor active region that extends on the first semiconductor active region and on the exposed sidewall portions of the semiconductor source/drain layer; and
    forming an insulated gate electrode on the second semiconductor active region.

2. A method of claim 1, wherein the step of forming the first and second insulating layers comprises:
    forming a sacrificial layer between the semiconductor source/drain layer and the bulk semiconductor region;
    selectively etching through the semiconductor source/drain layer to define the opening and expose a portion of the sacrificial layer;
    selectively etching back the portion of the sacrificial layer to expose an underside surface of the semiconductor source/drain layer and define a gap between the semiconductor source/drain layer and the bulk semiconductor region; and
    filling the gap with an electrically insulating layer.

3. The method of claim 2, wherein the sacrificial layer is selected from the group consisting of SiGe and $CaF_2$.

4. The method of claim 2, wherein said step of selectively etching through the semiconductor source/drain layer comprises forming an etching mask having an opening therein on the semiconductor source/drain layer; and wherein said step of forming an insulated gate electrode comprises forming a gate electrode spacer layer on the etching mask, selectively etching back a portion of the gate electrode spacer layer to expose a portion of the second semiconductor active region, and thermally oxidizing the exposed portion of the second semiconductor active region to define a gate insulating layer.

5. The method of claim 4, wherein said step of thermally oxidizing the exposed portion of the second semiconductor active region is followed by the steps of:
    forming a gate electrode layer that extends on the gate insulating layer and on an upper surface of the etching mask;
    planarizing the gate electrode layer to define a gate electrode in the opening in the etching mask and expose the upper surface of the etching mask;
    etching back a portion of the etching mask to expose portions of the semiconductor source/drain layer; and
    implanting source/drain region dopants into the exposed portions of the semiconductor source/drain layer.

6. A method of forming a semiconductor-on-insulator (SOI) field effect transistor with body contact, comprising:
    forming a semiconductor substrate comprising a bulk semiconductor region, a first insulating layer on the bulk semiconductor region, and a semiconductor source/drain layer on the first insulating layer, the semiconductor substrate having an opening which exposes a portion of the bulk semiconductor region, and a second insulating layer at sidewalls of the opening;
    epitaxially growing a semiconductor active region that extends on the bulk semiconductor region and on exposed sidewall portions of the semiconductor source/drain layer; and
    forming an insulated gate electrode on the second semiconductor active region;
    wherein the step of epitaxially growing the semiconductor active region comprises:
        epitaxially growing a first semiconductor active region from the exposed portion of the bulk semiconductor region;
        epitaxially growing a second semiconductor active region that extends on the first semiconductor active region and on the exposed sidewall portions of the semiconductor source/drain layer; and
        selectively etching back the second insulating layer to expose sidewall portions of the semiconductor source/drain layer, between the step of epitaxially growing the first semiconductor active region and the step of epitaxially growing the second semiconductor active region.

7. The method of claim 6, wherein the semiconductor substrate further comprises a sacrificial layer between the bulk semiconductor region and the semiconductor source/drain layer.

8. The method of claim 7, wherein the sacrificial layer is disposed at a same level with the first insulating layer.

9. The method of claim 7, wherein the sacrificial layer is selected from the group consisting of SiGe and $CaF_2$.

10. A method of forming a semiconductor-on-insulator (SOI) field effect transistor with body contact, comprising:
    forming a semiconductor substrate comprising a bulk semiconductor region, a sacrificial layer on the bulk semiconductor region and a semiconductor source/drain layer on the sacrificial layer;
    selectively etching through the semiconductor source/drain layer to define an opening therein and expose a portion of the sacrificial layer;
    selectively etching back a portion of the sacrificial layer to expose an underside surface of the semiconductor source/drain layer and define a gap between the semiconductor source/drain layer and the bulk semiconductor region;

filling the gap and lining sidewalls of the opening in the semiconductor source/drain layer with an electrically insulating layer;

epitaxially growing a semiconductor active region that extends on the bulk semiconductor region and on exposed sidewall portions of the semiconductor source/drain layer; and forming an insulated gate electrode on the second semiconductor active region.

11. The method of claim 10, further comprising:

selectively etching a portion of the electrically insulating layer in the opening to expose a portion of the bulk semiconductor region, before the step of epitaxially growing the semiconductor active region.

12. The method of claim 10, wherein the step of epitaxially growing a semiconductor active region comprises:

epitaxially growing a first semiconductor active region from the exposed portion of the bulk semiconductor region;

then selectively etching back the electrically insulating layer from within the opening in the semiconductor source/drain layer to expose sidewall portions of the semiconductor source/drain layer; and epitaxially growing a second semiconductor active region that extends on the first semiconductor active region and on the exposed sidewall portions of the semiconductor source/drain layer.

\* \* \* \* \*